(12) United States Patent
Karpman (10) Patent No.: US 10,681,821 B2
(45) Date of Patent: Jun. 9, 2020

(54) METHODS AND DEVICES FOR IMPROVED SPACE UTILIZATION IN WAFER BASED MODULES

(71) Applicant: The Charles Stark Draper Laboratory, Inc., Cambridge, MA (US)

(72) Inventor: Maurice S. Karpman, Brookline, MA (US)

(73) Assignee: THE CHARLES STARK DRAPER LABORATORY, INC., Cambridge, MA (US)

(*) Notice: Subject to any disclaimer, the term of this patent is extended or adjusted under 35 U.S.C. 154(b) by 0 days.

(21) Appl. No.: 14/515,826

(22) Filed: Oct. 16, 2014

(65) Prior Publication Data

US 2016/0113139 A1    Apr. 21, 2016

(51) Int. Cl.
| | |
|---|---|
| H05K 7/00 | (2006.01) |
| H05K 3/28 | (2006.01) |
| H05K 1/18 | (2006.01) |
| H05K 3/36 | (2006.01) |
| H05K 1/14 | (2006.01) |

(52) U.S. Cl.
CPC ............ *H05K 3/284* (2013.01); *H05K 1/185* (2013.01); *H05K 3/36* (2013.01); *H01L 2224/48091* (2013.01); *H05K 1/14* (2013.01); *H05K 2201/09118* (2013.01); *H05K 2201/10151* (2013.01); *H05K 2203/1327* (2013.01); *H05K 2203/1469* (2013.01)

(58) Field of Classification Search
CPC ......... H05K 1/181; H05K 2201/10015; H05K 2201/10022; H05K 2201/10151; H05K 2201/10977; H05K 3/10; H05K 3/284; H05K 3/303
See application file for complete search history.

(56) References Cited

U.S. PATENT DOCUMENTS

| | | | | |
|---|---|---|---|---|
| 5,554,806 A | * | 9/1996 | Mizuno .................. | G01P 1/023 73/493 |
| 5,631,809 A | * | 5/1997 | Takagi ................ | H01L 23/3107 174/351 |
| 2005/0269681 A1 | * | 12/2005 | Asahi .................. | H01L 21/6835 257/686 |

(Continued)

*Primary Examiner* — Yuriy Semenenko
(74) *Attorney, Agent, or Firm* — Womble Bond Dickinson (US) LLP; John J. Penny, Jr.

(57) ABSTRACT

Techniques for constructing a wafer based module are provided herein. For example, the techniques include providing a substrate, forming a pattern of conductive material relative to at least one of a surface plane of the substrate and an internal location within the substrate with the pattern of the conductive material including at least an exposed portion, mounting at least one electronic module to the exposed portion of the pattern of the conductive material, orienting the substrate orthogonal relative to a planar mounting surface such that the surface plane of the substrate is substantially orthogonal to the planar mounting surface, mounting one or more additional electronic modules on the planar mounting surface; and forming the semiconductor device by encapsulating the substrate, including the pattern of conductive material, the at least one electronic module and the one or more additional electronic modules within a mold compound.

8 Claims, 9 Drawing Sheets

(56) References Cited

U.S. PATENT DOCUMENTS

| | | | | |
|---|---|---|---|---|
| 2007/0283759 A1* | 12/2007 | Schnetker | ............ | G01M 7/025 |
| | | | | 73/577 |
| 2007/0290048 A1* | 12/2007 | Singleton | .......... | B29C 45/14647 |
| | | | | 235/492 |
| 2011/0308839 A1* | 12/2011 | Eguchi | .................... | H05K 1/03 |
| | | | | 174/250 |
| 2012/0106112 A1* | 5/2012 | Knies | ...................... | H01L 24/97 |
| | | | | 361/783 |
| 2013/0256896 A1* | 10/2013 | Xue | ..................... | H01L 23/041 |
| | | | | 257/773 |
| 2016/0190053 A1* | 6/2016 | Machida | ........... | H01L 23/49827 |
| | | | | 361/768 |

* cited by examiner

METHODS AND DEVICES FOR IMPROVED SPACE UTILIZATION IN WAFER BASED MODULES

TECHNICAL FIELD

The present disclosure relates generally to semiconductor devices, and, more particularly, to improved space utilization for design, construction, and fabrication of high density electronic modules such as wafer based modules.

BACKGROUND

High density electronic devices have been designed and fabricated to satisfy the increasing demand for high levels of functionality in small packages. Products that may be made from the modules include memory, digital logic, processing devices, and analog Radio Frequency (RF) circuits, sensors, etc. Typical integration of high density electronic devices achieves an integration density that is many times greater than, for example, surface mount technology ("SMT"), and has a lower set-up cost and development time.

Conventional fabrication techniques for these high density electronic devices include, for example, forming die(s) (or other electronic modules), forming through substrate vias (TSVs), positioning the die(s) (or other electronic modules) and the TSVs on a mounting surface, encapsulating the die(s) and the TSVs in a mold compound, and forming one or more electrical layers along surfaces of the mold compound (e.g., top-side electrical layers, bottom-side electrical layers, etc.). Importantly, the TSVs provide electrical interconnection between such electrical layers.

For certain applications, large size electronic modules are required (e.g., integrated circuits, micro-electromechanical (MEMs) sensors, and the like). For these applications, the relatively large size electronic modules prove limiting to the overall integration density. Accordingly, a need remains for fabrication techniques that improve space utilization for high density electronic modules, particularly adapted for wafer based modules.

SUMMARY

In accordance with one or more embodiments described herein, this disclosure provides methods of forming semiconductor devices with improved space utilization for high density electronic modules. In general, the techniques disclosed herein couple or mount an electronic module (e.g., a MEMs sensor) to conductive material and orient the electronic module and conductive material orthogonal to a mounting surface. Additional electronic modules (e.g., die(s), etc.) are placed on the mounting surface and each of the electronic module, the conductive material, and the additional electronic modules are encapsulated by a mold compound to yield a semiconductor device. Accordingly, while conventional approaches orient each electronic module in the same fashion, relative to a mounting surface, the approaches disclosed herein orient electronic modules in more than one direction, relative to the mounting surface to reduce overall volume of mold compound and decrease overall substrate dimensions (e.g., height, width, length, etc.).

According to one or more embodiments of the disclosure, techniques for forming a semiconductor device include providing a substrate such as a printed circuit board (PCB) and the like, and forming a pattern of conductive material along at least a surface plane of the substrate. Preferably, the pattern of the conductive material includes, for example, an exposed portion, an internal portion, an enclosed portion, etc. The techniques further include steps for mounting at least one electronic module to the exposed portion of the pattern of the conductive material. Notably the electronic module can include, for example, a micro-electromechanical (MEM) sensor, a die, an integrated circuit (IC), through-substrate vias (TSVs) and the like, and the mounting can be achieved using electrical leads, various surface mounting technologies (SMTs) and the like. The substrate, including the pattern of the conductive material, is oriented relative to a planar mounting surface such that the surface plane of the substrate, including the pattern of the conductive material, is substantially orthogonal to the planar mounting surface. One or more additional electronic modules are mounted on the planar mounting surface. For example, in mounting the one or more additional electronic modules, electrical connections associated with each one or more additional electronic module can be oriented proximate the mounting surface. The semiconductor device is formed by encapsulating the substrate, including the pattern of conductive material, the at least one electronic module and the one or more additional electronic modules within a mold compound. Optionally, in certain embodiments, additional steps include forming at least one interconnect layer along at least one of a top surface and a bottom surface of the encapsulated substrate of the semiconductor device, electrically coupling at least a portion of conductive material to at least a portion of the interconnect layer, and forming one or more interconnection busses on one of a bottom surface and a top surface of the encapsulated substrate of the semiconductor device.

According to certain other embodiments, an electrical component device having a high component density is disclosed. The electrical component device, according to this embodiment, includes a planar bottom surface and a planar top surface. The planar top surface is substantially parallel to and located on an opposite side of the electrical component device relative to the planar bottom surface. The electrical component device also includes a mold compound disposed between the planar bottom surface and the planar top surface, and one or more electrical modules disposed within the mold compound. The electrical modules are operatively connected to at least one of the planar bottom surface and the planar top surface with each electrical module having a substantially planar electrical interconnection surface oriented substantially parallel to at least one of the planar bottom surface and the planar top surface. The electrical component device further includes a component assembly disposed within the mold compound, which component assembly is operatively connected to at least one of the planar bottom surface and the planar top surface. The component assembly includes a substantially planar electrical interconnection surface oriented substantially orthogonal to at least one of the planar bottom surface and the planar top surface.

For example, the component assembly can include a substrate having a substrate interconnect surface configured to connect to at least one of the planar bottom surface and the planar top surface of the electrical component device, and at least one additional electrical module having the substantially planar electrical interconnect surface that operatively couples to at least a portion of the substrate interconnect surface. In further embodiments, the substrate interconnect surface includes a pattern of conductive material formed to connect to the at least one of the planar bottom surface and the planar top surface of the electrical component device, and the planar electrical interconnect surface of the at least one additional electrical module electrically couples to at least a portion of the pattern of conductive material. In this fashion, the at least one additional electrical module of the component assembly operatively is coupled to at least the portion of the substrate interconnect surface.

Similar to the methods and techniques discussed above, the substrate of the component assembly can include a printed circuit board, with the substrate interconnect surface comprising a pattern of conductive material.

In additional embodiments, the electrical component device can further include interconnect layers (e.g., formed along the top surface, the bottom surface, or combinations thereof), with the electronic modules and the component assembly electrically coupled thereto.

It should be appreciated that the present technology can be implemented and utilized in numerous ways, including without limitation as a process, an apparatus, a system, a device, a method for applications now known and later developed, a computer readable medium, appropriate hardware (e.g., hardware processors), circuitry, and software supporting the same. These and other unique features of the technology disclosed herein will become more readily apparent from the following description and the accompanying drawings.

BRIEF DESCRIPTION OF THE DRAWINGS

The embodiments herein may be better understood by referring to the following description in conjunction with the accompanying drawings in which like reference numerals indicate identically or functionally similar elements, of which.

DESCRIPTION OF EXEMPLARY EMBODIMENTS

The present disclosure overcomes many of the prior art problems associated with the advantages, and other features of the system disclosed herein, will become more readily apparent to those having ordinary skill in the art from the following detailed description of certain preferred embodiments taken in conjunction with the drawings which set forth representative embodiments of the present invention and wherein like reference numerals identify similar structural elements, as mentioned above.

All relative descriptions herein such as left, right, up, and down are with reference to the Figures, and not meant in a limiting sense. Additionally, for clarity common items and circuitry such as filters, resistors, capacitors, transistors, and the like, have not been included in the Figures as would be appreciated by those of ordinary skill in the pertinent art. Unless otherwise specified, the illustrated embodiments can be understood as providing exemplary features of varying detail of certain embodiments, and therefore, unless otherwise specified, features, components, modules, elements, and/or aspects of the illustrations can be otherwise combined, interconnected, sequenced, separated, interchanged, positioned, and/or rearranged without materially departing from the disclosed systems or methods. Additionally, the shapes and sizes of components are also exemplary and unless otherwise specified, can be altered without materially affecting or limiting the disclosed technology.

Wafer based modules, including high density electronic devices, are typically formed by fabricating a silicon wafer with embedded electronic modules (e.g., chip scale components) using a molding process. Importantly, most embedded chip scale components include various circuitry contained within a housing and electrical contacts along one surface of the housing (e.g., a bottom surface). During conventional molding processes, the desired chip scale components are typically oriented on a mounting surface with the electrical contacts facing upward or downward relative to the mounting surface. That is, the electrical contacts along surface of the housing are located on a housing surface proximate the mounting surface or on a housing surface opposite thereof. Conventional molding processes teach orienting the chip scale component relative to the mounting surface in this fashion in order to electrically connect such electrical contacts during subsequent fabrication steps—e.g., forming top and bottom side interconnect structures and through-substrate vias (TSVs).

Figure 1A:
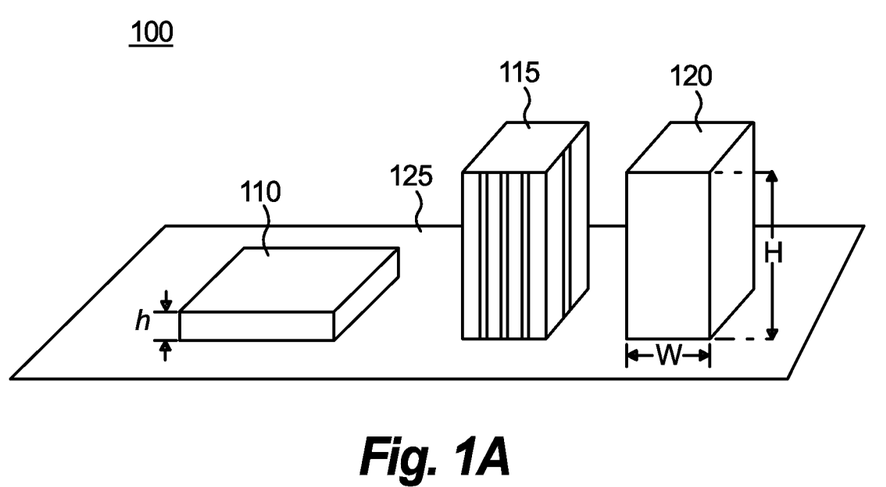
FIG. 1A illustrates a perspective view of various electronic modules oriented on a mounting surface.
Figure 1B:
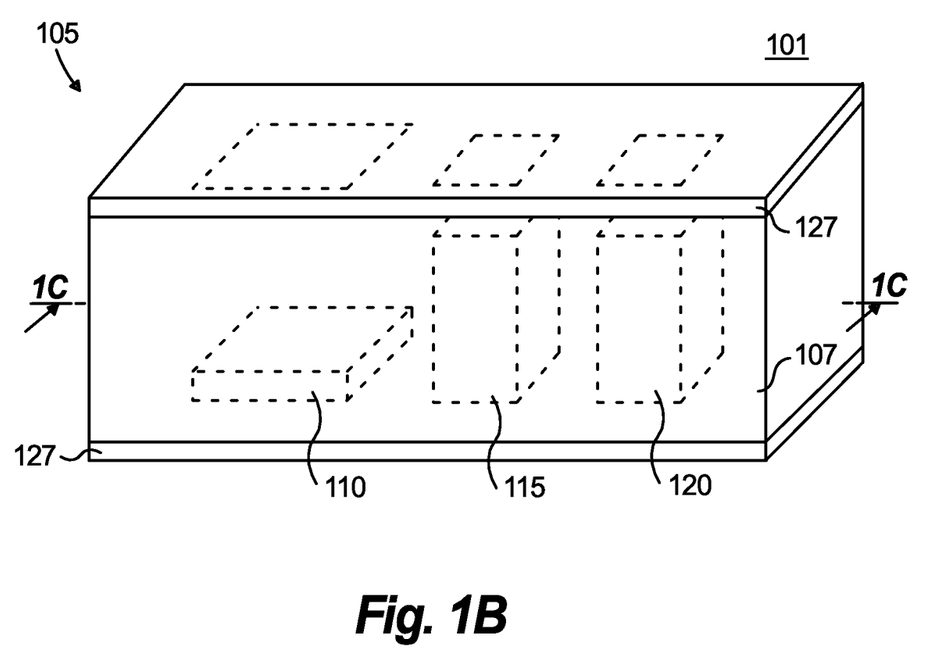
FIG. 1B illustrates a perspective view of the electronic modules shown in FIG. 1 encapsulated in a mold compound.
Figure 1C:
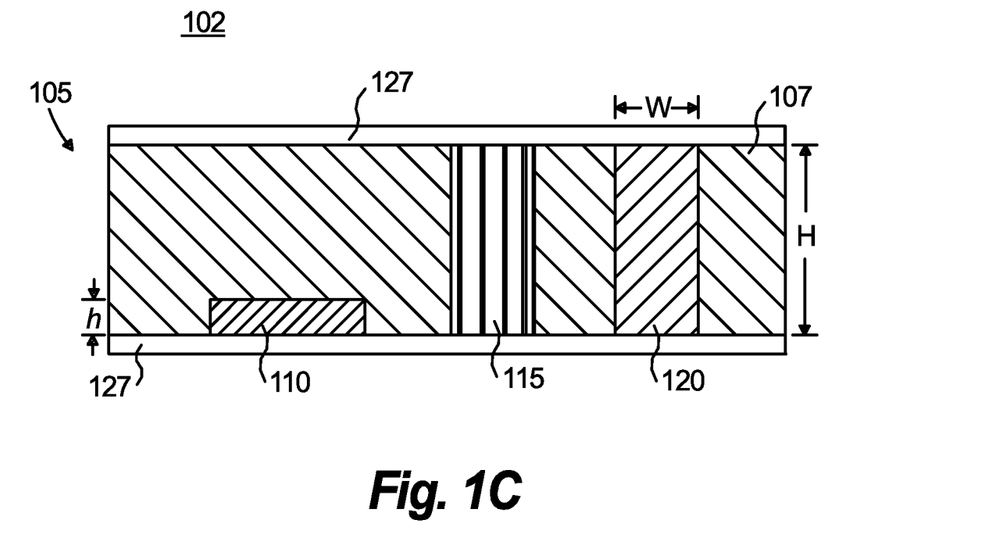
FIG. 1C illustrates a cross sectional elevation view of the mold compound shown in FIG. 1B taken viewed from cut lines 1C.

FIGS. 1A-1C, collectively, illustrate an exemplary fabrication process for a wafer based module 105 such as a semiconductor device. In particular, FIG. 1A illustrates a perspective view 100 of various electronic modules, labeled as shown—modules "110", "115", and "120"—oriented on a mounted surface 125 such that electronic connections to each of the electronic modules are proximate mounting surface 125. Electronic modules, as disclosed herein, include, but are not limited to any electronic modules used in manufacturing a wafer based module or a semiconductor device. For example, the electronic modules can include micro-electromechanical (MEM) sensors, one or more die, integrated circuits (ICs), through-substrate vias (TSVs), and the like. It is also appreciated that the views shown in FIGS. 1A-1C are provided for simplicity, and not limitation, where electronic module 110 is a die, electronic module 115 is a TSV, and electronic module 120 is a MEMs sensor.

Still referring to FIG. 1A, dimensional components for electronic module 110 and electronic module 120 are provided. As discussed above, conventional approaches to wafer based manufacture typically orient electronic modules one or two directions relative to a mounting surface—a face-down direction with electrical connections proximate to mounting surface 125 (as shown here) or a face-up direction with electrical connections located on a distal side of the electronic module (e.g., a side opposite to the side proximate) relative to mounting surface 125. However, such conventional approaches prove inefficient at space utilization when, for example, certain applications require electronic modules having large dimensional variances.

FIG. 1B illustrates a perspective view 101 of a wafer based module 105, including the electronic modules 110, 115, and 120 encapsulated in a mold compound 107. Additionally, two interconnection layers 127 are located along a top surface and a bottom surface of the wafer based module 105. As discussed above, such interconnection layers 127 generally connect to electrical connections for each electronic module, as is appreciated by those skilled in the art.

FIG. 1C illustrates a cross sectional elevation view 102 of FIG. 1B, viewed from cut lines 1C. As discussed above, electronic module 115 is a through-substrate via (TSV) that electrically couples various interconnection layers—here interconnection layers 127—of the wafer based module 105.

FIGS. 1A-1C also illustrate space utilization inefficiencies by providing various dimensions associated with electronic module 110 (height (h)) and electronic module 120 (height (H) and width (W)). As shown, using conventional approaches described above, electronic module 120 can be oriented with electrical connections along a top surface (with electronic module 120 oriented in the face-up direction) or along a bottom surface (with electronic module oriented in the face-down direction). In either orientation, the height (H) of electronic module 120 is substantially greater than the height (h) of electronic module 110. In contrast, the width (W) of electronic module 120 is not significantly greater than the height (h) of electronic module 110. However, according to conventional approaches, subsequent formation steps such as mold compound encapsulation (shown in FIGS. 1B-1C) yield a wafer based module 105 with dimensions (and a volume of encapsulate mold compound) constrained by the orientation of electronic module 120. Notably, electronic module 115 is likewise constrained by the dimensions of electronic module 120 since electronic module 115 is a through-substrate via, responsible for electrically conducting signals through wafer based module 105 to electrical busses (e.g., interconnection layers).

In accordance with this disclosure, techniques are provided for improving space utilization during wafer based module manufacture. As discussed above, these techniques couple or mount an electronic module to a conductive material and orient the electronic module and conductive material orthogonal relative to a mounting surface. Additional electronic modules are placed on the mounting surface and both the additional electronic modules and the electronic module mounted to conductive material (and the conductive material) are encapsulated within a mold compound to form a wafer based module—here a semiconductor device—having improved space utilization.

Figure 2:
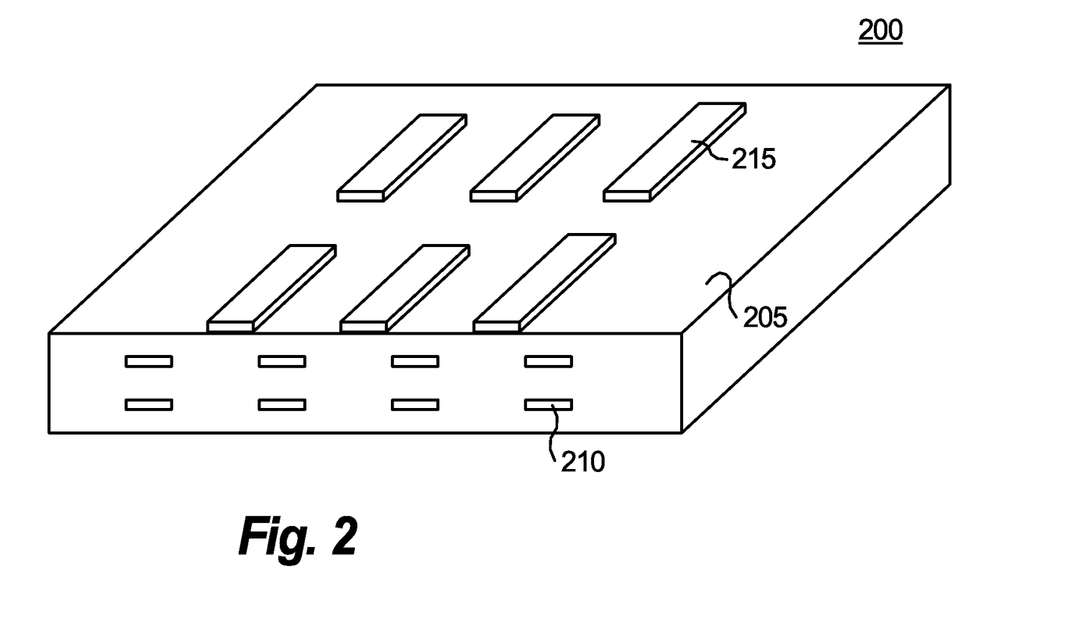
FIG. 2 illustrates a perspective view of a printed circuit board (PCB), showing one or more conductive leads formed along a surface of the PCB and embedded within the PCB.
Figure 3:
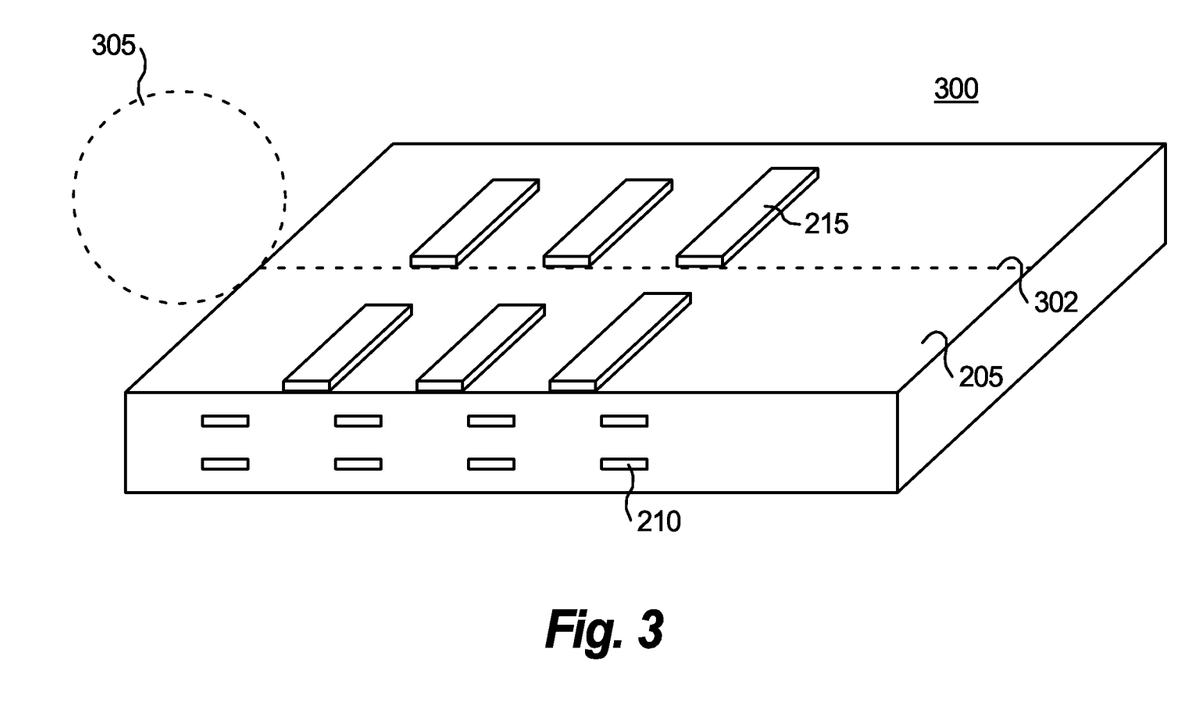
FIG. 3 illustrates a perspective view of the PCB shown in FIG. 2, showing cut-lines to dice the PCB into multiple sub-sections.

FIGS. 2-8 collectively illustrate various perspective views of the improved space utilization process for wafer based modules. FIGS. 2-3 particularly show two perspective views of the process to form a pattern of conductive material, which is subsequently coupled to one or more electronic modules (shown in FIG. 4).

Referring now to FIG. 2, a perspective view 200 is provided, showing a substrate, namely a printed circuit board (PCB) 205, having various traces 210 and 215. Traces 210 are embedded in PCB 205 while traces 215 are formed along a top surface of PCB 205, respectively. PCB 205 can be fabricated as appreciated by those skilled in the art, using conventional, planar techniques. Traces 210 and 215 include conductive material and are formed according to a pattern—here a linear pattern formed along a surface plane of PCB 205 and embedded within PCB 205, respectively.

FIG. 3 illustrates a perspective view 300 of PCB 205, showing a dash cut-line 302, by which PCB 205 is divided or diced by a cutting instrument 305 into multiple sub-sections. Each of these sub-sections form individual substrates that can include one or more of traces 210 and/or traces 215 as appropriate.

Figure 4:
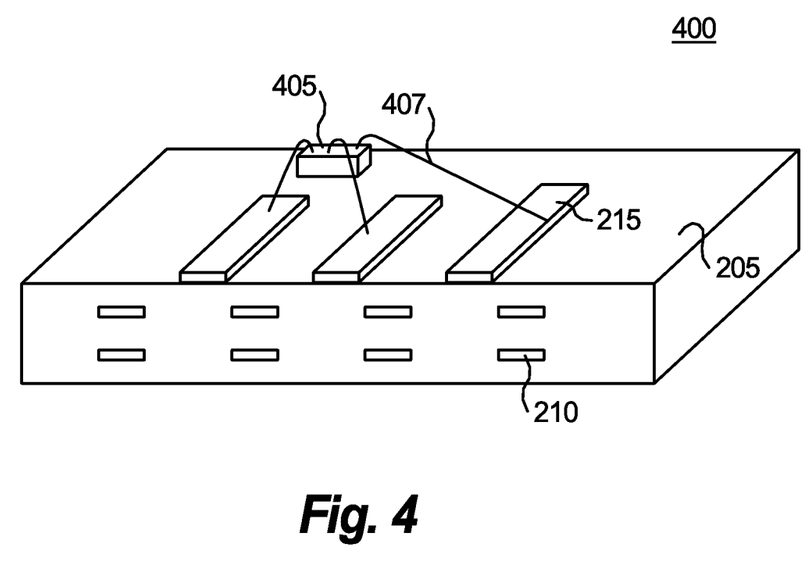
FIG. 4 illustrates a perspective view of an electronic module electrically coupled to one of the sub-sections of the PCB shown in FIG. 3.

FIG. 4 illustrates a perspective view of one sub-section substrate 400, including an electronic module 405. As shown, electronic module 405 is electrically coupled to the substrate—particularly, traces 215—by one or more electrical leads 407. Importantly, traces 215 and/or traces 210 are formed to include a portion of exposed conductive material for this electrical coupling. Also, while perspective view 400 shows electrical coupling using electrical leads 407, it is appreciated that any suitable type of electrical coupling can be used, as is appreciated by those skilled in the art (e.g., using surface mounting technologies, and the like).

Figure 5:
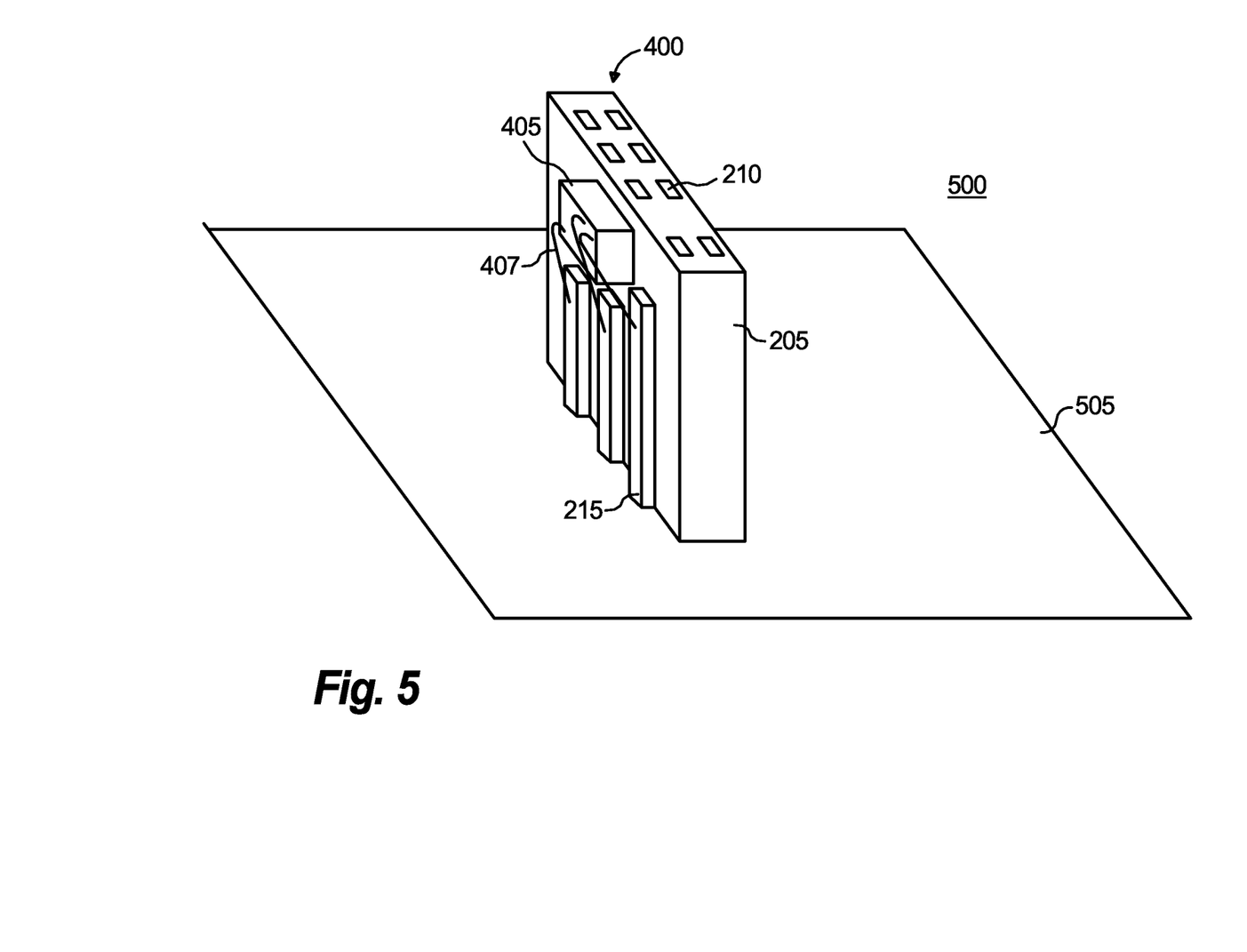
FIG. 5 illustrates a perspective view of the sub-section of the PCB oriented substantially orthogonal to a mounting surface.

FIG. 5 illustrates a perspective view 500 of substrate 400 oriented substantially orthogonal to a mounting surface 505. As shown, the orthogonal direction refers to an orientation of electronic module 405 relative to mounting surface 505. As discussed above, conventional techniques for mounting electronic modules in a wafer based module included orienting the electronic modules in one or two directions—face-up or face-down, with electrical contacts oriented proximate a mounting surface or oriented on a surface of the electronic module opposite to the surface proximate the mounting surface. Here, electronic module 405 is oriented orthogonal to such direction, having electrical contacts facing a direction parallel to mounting surface 505. Additionally, as shown in view 500, at least a portion of the pattern of conductive material forming traces 210 and/or traces 215 terminate(s) proximate mounting surface 505 and at least a portion of the conductive material particularly forming traces 215 terminates on a side of substrate 400 opposite to the side proximate mounting surface 505. As discussed in greater detail below, traces 210 and/or traces 215 provide electrical coupling to electronic module 405 from two surfaces of an encapsulating mold.

Figure 6:
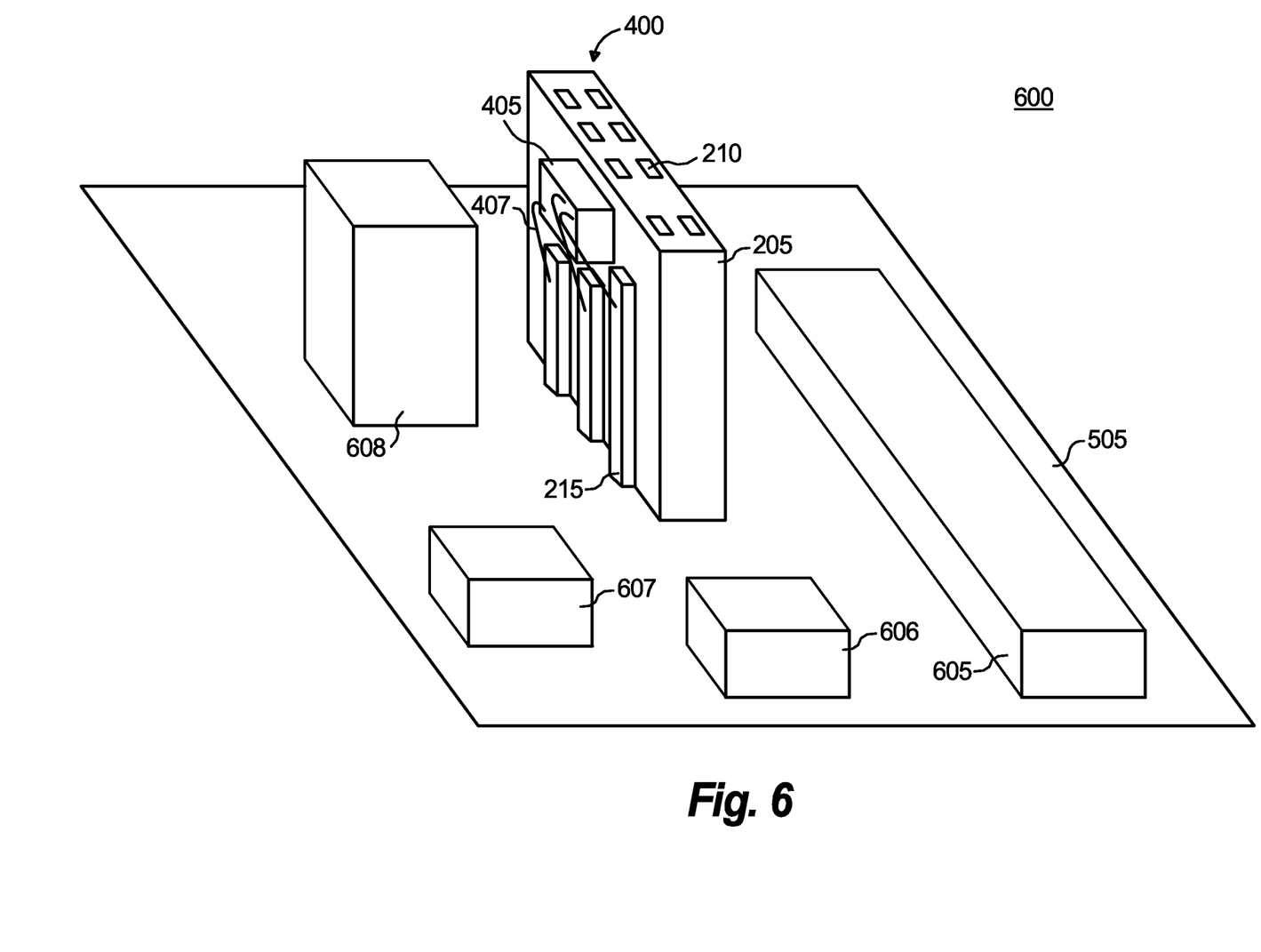
FIG. 6 illustrates a perspective view of one or more additional electronic modules oriented on the mounting surface.

FIG. 6 illustrates a perspective view 600 showing additional electronic modules—i.e., labeled as shown "605", "606", "607", and "608", oriented on the mounting surface 505. In particular, the additional electronic modules are oriented in a face-down direction with respective electrical contacts proximate mounting surface 505. It is appreciated that the view 600 is shown for simplicity and other orientations of the additional electronic modules are within the scope of this disclosure. Further, the electronic module 407 and the additional electronic modules 605-608, can include any suitable electronic module, including but not limited to: integrated circuits (ICs), MEMs sensors, one or more die, passive components such as capacitors, resistors and inductors, and the like.

Figure 7:
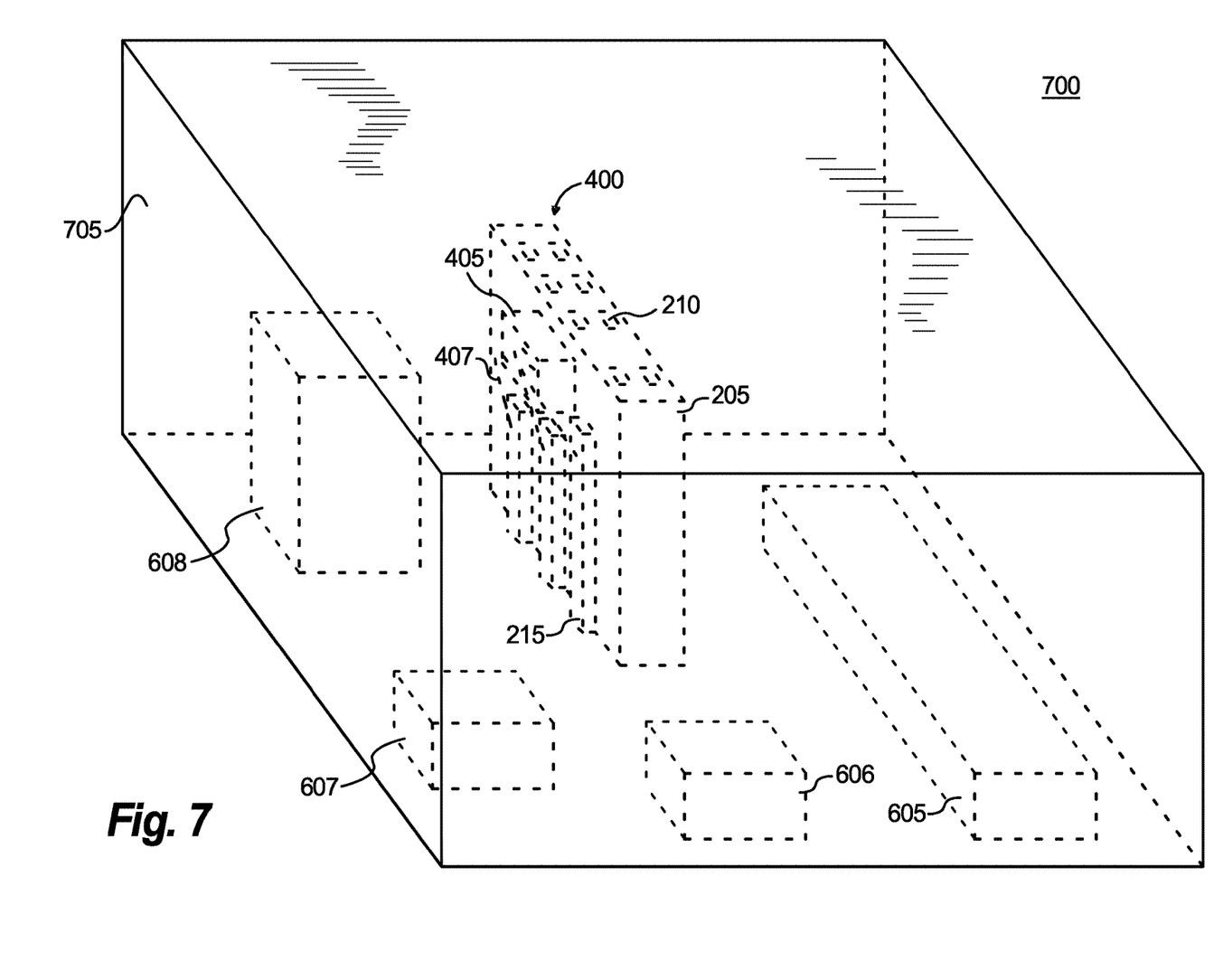
FIG. 7 illustrates a top perspective view of the sub-section of the PCB, including the electrically coupled electronic module, and the one or more additional electronic modules encapsulated in a mold compound to yield a semiconductor device.

FIG. 7 illustrates a top perspective view of a wafer based module or semiconductor device 700, showing the substrate 400 (with electronic module 405, leads 407, and traces 210/215), and the additional electronic modules 605-608, encapsulated within a mold compound 705. As is appreciated by those skilled in the art, a mold compound—here mold compound 705—is generally applied to mounting surface 505, including the various electronic modules and associated components. The mold compound 705 can include, for example, epoxy, plastic, resin, and the like, and the mold compound can be applied using various techniques such as over molding, transfer molding, and various other molding processes. Optionally, as is shown in semiconductor device 700, a back surface of the embedded substrate 400 is exposed on the top surface of semiconductor device 700. Subsequent steps can form various dielectric layers, interconnect layers, and the like, which can electrically connect to the exposed traces 210 of substrate 400.

Figure 8:
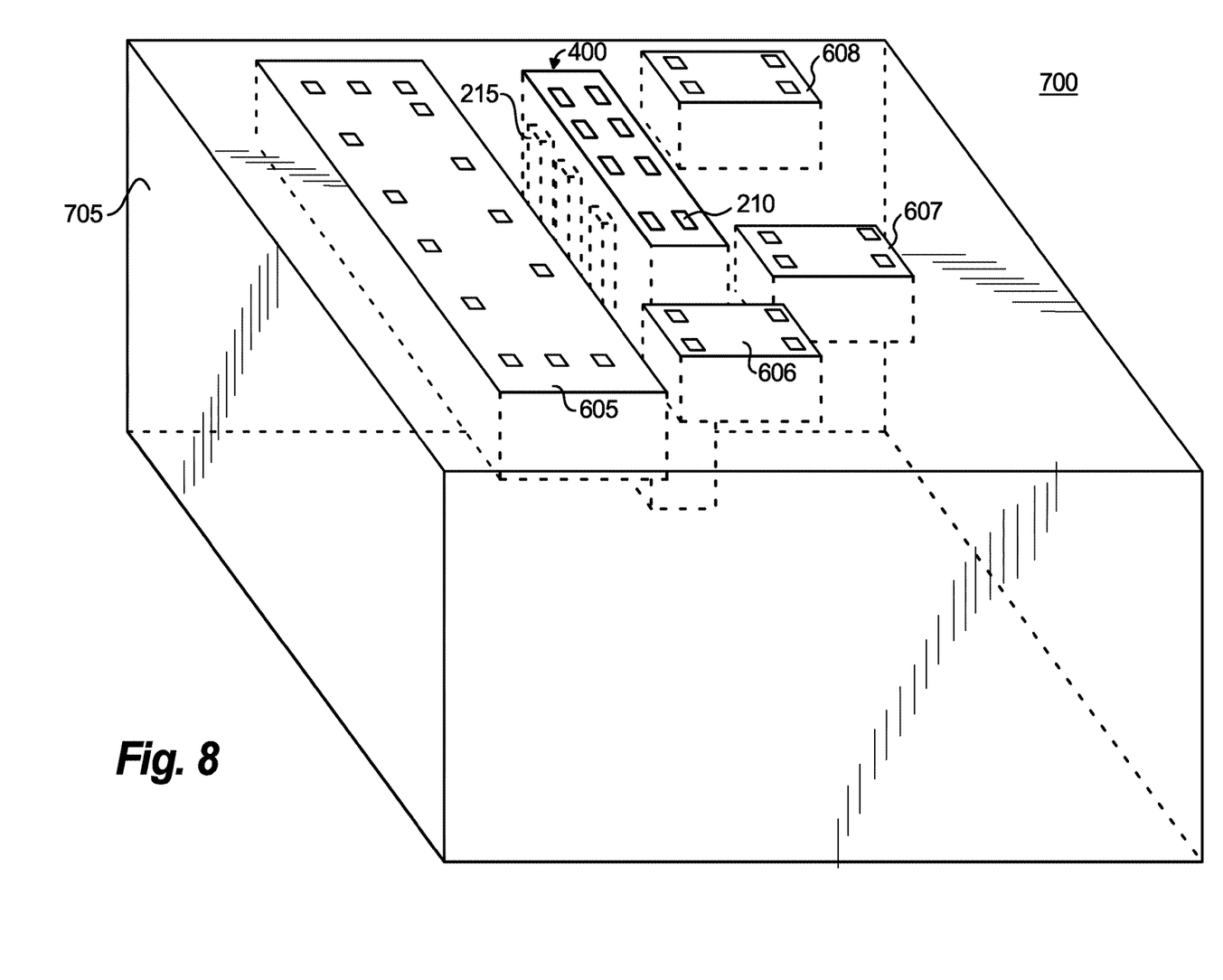
FIG. 8 illustrates a bottom perspective view of the semiconductor device shown in FIG. 7, showing exposed portions of electrical contacts of various electronic modules encapsulated in the mold compound.

FIG. 8 a bottom perspective view of the semiconductor device 700, showing exposed portions of electrical contacts of various electronic modules encapsulated in the mold compound 705. Recall, as discussed above, the additional electronic modules 605-608 are oriented in a face-down direction on the mounting surface 505, whereby electrical contacts are proximate the mounting surface 505. Typically, post mold encapsulation, the semiconductor device 700 is removed from mounting surface 505 to expose the electrical contacts of face-down electronic modules. Optionally, additional steps may be required to mill portions of the mold compound to fully expose certain electrical contacts, as is appreciated by those skilled in the art. Further, as shown in FIG. 8, portions of traces 215, which are electrically coupled to electronic device 405, are also exposed. Such traces, as discussed above, can be used to electrically couple electronic module 405 to one or more dielectric layers, interconnection layers, and the like.

In sum, referring collectively to FIGS. 2-8, the improved space utilization techniques provide for a wafer based module or semiconductor device having one or more electronic modules oriented orthogonal to a mounting surface. Particulars of the fabrication process are further illustrated in the exemplary procedure shown in FIG. 9.

Figure 9:
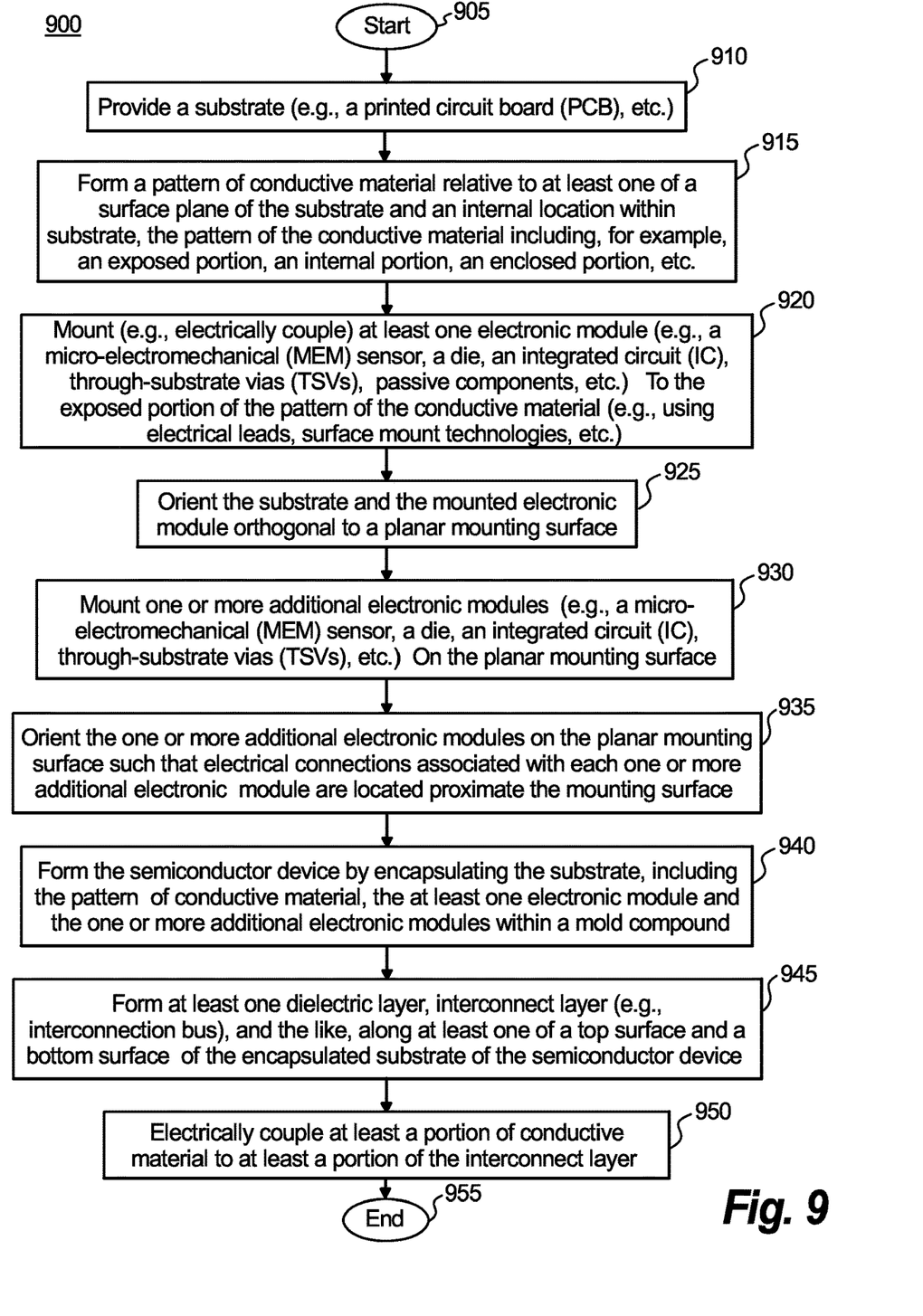
FIG. 9 illustrates an exemplary procedure for forming a semiconductor device in accordance with one or more embodiments disclosed herein.

FIG. 9 illustrates an exemplary procedure 900 for forming a semiconductor device (i.e., semiconductor device 700) in accordance with one or more embodiments disclosed herein.

Procedure 900 begins at step 905 and continues to step 910 where, as discussed above, a substrate is provided. The substrate can include, for example, a printed circuit board (PCB), which is shown in FIGS. 2-8. In step 915, a pattern of conductive material is formed (e.g., traces 210 and 215) relative to a surface plane of the substrate (e.g., along at least a surface plane shown by traces 215) and/or an internal location of the substrate (e.g., embedded within the substrate shown by traces 210). Notably, the pattern of the conductive material or traces can include, for example, exposed portions, internal or embedded portions, enclosed or insulated portions, and the like. In step 920, at least one electronic module is mounted to or electrically coupled with the exposed portion of the pattern of the conductive material. The electronic module can include, for example, a microelectromechanical (MEM) sensor, a die, an integrated circuit (IC), through-substrate vias (TSVs), passive components, etc. As discussed above, mounting or electrically coupling can be achieved using various means, such as: electrical leads, surface mounting technologies, and the like.

Once mounted or electrically coupled, the substrate is oriented, in step 925, relative to a planar mounting surface such that the surface plane of the substrate is substantially orthogonal to the planar mounting surface. Additional electronic modules can be mounted on the planer mounting surface in step 930, with such additional electronic modules oriented, in step 935, with corresponding electrical connections proximate the mounting surface.

A semiconductor device is formed in step 940, by encapsulating the substrate, including the pattern of conductive material, the at least one electronic module and the one or more additional electronic modules within a mold compound (e.g., mold compound 705). Optionally, as discussed above, dielectric layers, interconnect layers, and the like can be formed, in step 945, along at least one of a top surface and a bottom surface of the encapsulated substrate of the semiconductor device.

Further, in step 950, at least a portion of the conductive material (e.g., exposed portions shown in FIGS. 7-8) are electrically coupled to at least a portion of the interconnect layer.

Procedure 900 subsequently ends at step 955, but may begin again at step 910 where, as discussed above, a substrate is provided.

It should be noted that while certain steps within procedure 900 may be optional as described above, the steps shown in FIG. 9 are merely examples for illustration, and certain other steps may be included or excluded as desired. Further, while a particular order of the steps are shown, this ordering is merely illustrative, and any suitable arrangement of the steps may be utilized without departing from the scope of the embodiments herein.

The techniques described herein improve space utilization for wafer based modules such as semiconductor devices. These techniques provide for orthogonal orientation of certain electronic modules relative to a mounting surface, which advantageously overcomes conventional two-direction limitations of electronic module mounting.

While the foregoing description has been directed to specific embodiments, it will be apparent, however; that other variations and modifications may be made to the described embodiments, with the attainment of some or all of their advantages. Accordingly this description is to be taken only by way of example and not to otherwise limit the scope of the embodiments herein. Therefore, it is the object of the appended claims to cover all such variations and modifications as come within the true spirit and scope of the embodiments herein.

What is claimed is:

1. An electrical component device having high component density comprising:
   a planar bottom surface;
   a planar top surface, the planar top surface being substantially parallel to and located on an opposite side of the electrical component device relative to the planar bottom surface;
   a mold compound disposed between the planar bottom surface and the planar top surface;
   one or more electronic modules disposed within the mold compound and operatively connected to at least one of the planar bottom surface and the planar top surface, each electronic module having a substantially planar electrical interconnection surface oriented substantially parallel to at least one of the planar bottom surface and the planar top surface and having electrical contacts facing a direction parallel to the at least one of the planar bottom surface and the planar top surface; and
   a component assembly disposed within the mold compound and operatively connected to at least one of the planar bottom surface and the planar top surface, the component assembly having a substantially planar electrical interconnection surface oriented substantially orthogonal to at least one of the planar bottom surface and the planar top surface, wherein the electrical component device further comprises traces that provide electrical coupling to the one or more electronic modules from two surfaces of the mold compound and at least a portion of the traces terminate on a side of the substrate opposite of the planar top surface.

2. The electrical component device of claim 1, wherein the component assembly further comprises:
   a substrate having a substrate interconnect surface that connects to at least one of the planar bottom surface and the planar top surface of the electrical component device; and
   at least one additional electronic module having a substantially planar electrical interconnect surface that operatively couples to at least a portion of the substrate interconnect surface.

3. The electrical component device of claim 2, wherein the substrate interconnect surface includes:
   a pattern of conductive material formed to connect to the at least one of the planar bottom surface and the planar top surface of the electrical component device,
   wherein the pattern of the conductive material includes at least an exposed portion.

4. The electrical component device of claim 3, wherein the planar electrical interconnect surface of the at least one additional electronic module electrically couples to at least a portion of the pattern of conductive material to operatively couple the at least one additional electronic module to at least the portion of the substrate interconnect surface.

5. The electrical component device of claim 2, wherein the substrate is a printed circuit board, and wherein the substrate interconnect surface comprises a pattern of conductive material.

6. The electrical component device of claim 1, wherein the at least one electronic module includes at least one of a die, an integrated circuit (IC), and a passive component.

7. The electrical component device of claim 1, wherein the at least one electronic module is a die, and wherein the at least one of the additional electronic modules is a MEMS sensor.

8. The electrical component device of claim 1, further comprising:
   at least one interconnect layer formed along at least one of the planar bottom surface and the planar top surface, wherein the one or more electronic modules disposed within the mold compound and the component assembly are each operatively connected to the at least one interconnect layer.

* * * * *